(12) United States Patent
Jang (10) Patent No.: US 11,411,042 B2
(45) Date of Patent: Aug. 9, 2022

(54) IMAGE SENSOR WITH VARIANT GATE DIELECTRIC LAYERS

(71) Applicant: SK hynix Inc., Icheon-si (KR)

(72) Inventor: Jae Hyung Jang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 239 days.

(21) Appl. No.: 16/897,820

(22) Filed: Jun. 10, 2020

(65) Prior Publication Data

US 2021/0159265 A1    May 27, 2021

(30) Foreign Application Priority Data

Nov. 26, 2019   (KR) .................... 10-2019-0153176

(51) Int. Cl.
*H01L 27/148* (2006.01)
*H01L 27/146* (2006.01)

(52) U.S. Cl.
CPC .. *H01L 27/14812* (2013.01); *H01L 27/14612* (2013.01); *H01L 27/14643* (2013.01)

(58) Field of Classification Search
CPC ......... H01L 27/14812; H01L 27/14612; H01L 27/14643; H01L 27/14603; H01L 27/14625; H01L 27/14609; G01S 7/4914; G01S 17/36; G01S 17/894; H04N 5/374; H04N 5/3741; H04N 5/3745; H04N 5/3765; H04N 5/378
See application file for complete search history.

(56) References Cited

U.S. PATENT DOCUMENTS

| | | | | |
|---|---|---|---|---|
| 7,692,134 | B2* | 4/2010 | Nagaraja | H01L 27/14612 257/292 |
| 2014/0103412 | A1* | 4/2014 | Lee | H01L 27/14605 257/292 |
| 2015/0349005 | A1* | 12/2015 | Yamashita | H01L 27/14605 257/292 |
| 2017/0194372 | A1* | 7/2017 | Ha | H01L 27/1463 |
| 2017/0229510 | A1* | 8/2017 | Iida | H01L 27/1461 |

FOREIGN PATENT DOCUMENTS

| KR | 10-2010-0076429 A | 7/2010 |
|---|---|---|
| KR | 10-2016-0018506 A | 2/2016 |

* cited by examiner

*Primary Examiner* — Selim U Ahmed
(74) *Attorney, Agent, or Firm* — Perkins Coie LLP (57) ABSTRACT

An image sensor includes a substrate including a photodiode and first and second floating diffusion nodes which are disposed to be spaced apart from left and right of the photodiode, respectively, by a predetermined distance; a first transfer gate disposed on the substrate to overlap at least partially with the photodiode and the first floating diffusion node; and a second transfer gate disposed on the substrate to overlap at least partially with the photodiode and the second floating diffusion node, wherein each of the first transfer gate and the second transfer gate includes a first gate dielectric layer which overlaps at least partially with the photodiode and a second gate dielectric layer which overlaps at least partially with the first or second floating diffusion node, and wherein a thickness of the first gate dielectric layer is larger than a thickness of the second gate dielectric layer.

20 Claims, 9 Drawing Sheets

IMAGE SENSOR WITH VARIANT GATE DIELECTRIC LAYERS

CROSS-REFERENCES TO RELATED APPLICATION

This patent document claims priority and benefits of Korean Patent Application No. 10-2019-0153176, filed on Nov. 26, 2019 in the Korean Intellectual Property Office, which is incorporated by reference in its entirety as part of the disclosure of this patent document.

TECHNICAL FIELD

The technology and implementations disclosed in this patent document generally relate to an image sensor for sensing a distance from a target object.

BACKGROUND

An image sensor is a semiconductor device which captures an image by using the property of a semiconductor that reacts to light. With the development of the computer industry and communication industry, the demand for high-performance image sensing devices, for example, smartphones, digital cameras, game consoles, Internet of Things, robots, surveillance cameras, medical micro cameras, etc., has been increasing.

Image sensors may be generally classified into CCD (charge coupled device) image sensors and CMOS (complementary metal oxide semiconductor) image sensors. CCD image sensors have less noise and better image quality than CMOS image sensors. However, CMOS image sensors have a simpler and more convenient driving schemes, and thus may be preferred in some applications. Also, CMOS image sensors may integrate a signal processing circuit in a single chip, making it easy to miniaturize CMOS image sensors for implementation in a product, with the added benefits of consuming very low power. CMOS image sensors can be fabricated using CMOS fabrication technology, which results in low manufacturing costs. CMOS image sensing devices have been widely used due to their suitability for implementation in a mobile device.

SUMMARY

Various embodiments of the disclosed technology are related to an image sensor capable of effectively performing a sensing operation to measure distance. In various implementations, it is also possible to reduce time for the sensing operation of an image sensor.

Various objects to be achieved by the disclosure are not limited to the aforementioned objects, and those skilled in the art to which the disclosure pertains may clearly understand other objects from the following descriptions.

In one aspect, an image sensor is provided to comprise: a substrate including a photodiode and first and second floating diffusion nodes which are disposed to be spaced apart from left and right of the photodiode, respectively, by a predetermined distance; a first transfer gate disposed on the substrate to overlap at least partially with the photodiode and the first floating diffusion node; and a second transfer gate disposed on the substrate to overlap at least partially with the photodiode and the second floating diffusion node, wherein each of the first transfer gate and the second transfer gate includes a first gate dielectric layer which overlaps at least partially with the photodiode and a second gate dielectric layer which overlaps at least partially with the first or second floating diffusion node, and wherein a thickness of the first gate dielectric layer is larger than a thickness of the second gate dielectric layer.

In another aspect, an image sensing device is provided to include: a substrate; a photoelectric conversion element disposed in the substrate and configured to generate photocharges in response to an incident light; first and second floating diffusion nodes that are disposed in the substrate to be spaced apart from the photoelectric conversion element at opposite sides of the photoelectric conversion element respectively; a first transfer gate disposed on the substrate to overlap at least partially with the photoelectric conversion element and the first floating diffusion node; and a second transfer gate disposed on the substrate to overlap at least partially with the photoelectric conversion element and the second floating diffusion node, wherein each of the first transfer gate and the second transfer gate includes a first gate dielectric layer which overlaps at least partially with the photoelectric conversion element and a second gate dielectric layer which overlaps at least partially with the first or second floating diffusion node, and wherein a thickness of the first gate dielectric layer is greater than a thickness of the second gate dielectric layer.

In another aspect, an image sensor is provided to include: a substrate including a photodiode; a first transfer gate disposed on the substrate to overlap at least partially with one side of the photodiode; a second transfer gate disposed on the substrate to overlap at least partially with the other side of the photodiode; and a photodiode gate disposed between the first transfer gate and the second transfer gate, wherein each of the first transfer gate and the second transfer gate includes a first gate dielectric layer which overlaps at least partially with the photodiode and a second gate dielectric layer which has a thickness thinner than the first gate dielectric layer, and wherein, while the first transfer gate is applied with a first transfer signal corresponding to a logic high level, potential sequentially increases in order of an underside of the first gate dielectric layer of the second transfer gate, an underside of the second gate dielectric layer of the second transfer gate, an underside of the photodiode gate, an underside of the first gate dielectric layer of the first transfer gate and an underside of the second gate dielectric layer of the first transfer gate.

In another aspect, an image sensing device is provided to include: a substrate; a photoelectric conversion element disposed in the substrate and configured to generate photocharges in response to an incident light; a first transfer gate disposed on the substrate to overlap at least partially with one side of the photoelectric conversion element; a second transfer gate disposed on the substrate to overlap at least partially with the other side of the photoelectric conversion element; and a photoelectric conversion gate disposed between the first transfer gate and the second transfer gate, wherein each of the first transfer gate and the second transfer gate includes a first gate dielectric layer which overlaps at least partially with the photoelectric conversion element and having a first thickness and a second gate dielectric layer having a second thickness smaller than the first thickness, and wherein the first transfer gate is configured to receive a first transfer signal corresponding to a logic high level that provides a potential distribution increasing from an underside of the second transfer gate to an underside of the first transfer gate.

According to the embodiments disclosed in the present document, it is possible to improve photocharge transfer efficiency and photocharge transfer speed in a high speed operation of a time-of-flight (ToF) image sensor.

Besides, a variety of effects directly or indirectly understood through the present document may be provided.

BRIEF DESCRIPTION OF THE DRAWINGS

FIG. 3a is a cross sectional view illustrating an example representation of a partial region of FIG. 2a.

DETAILED DESCRIPTION

Hereinafter, various embodiments of the disclosed technology are described with reference to the accompanying drawings. However, the description is not intended to limit the present disclosure to particular embodiments, and it should be construed as including various modifications, equivalents, and/or alternatives according to the embodiments of the present disclosure.

Figure 1:
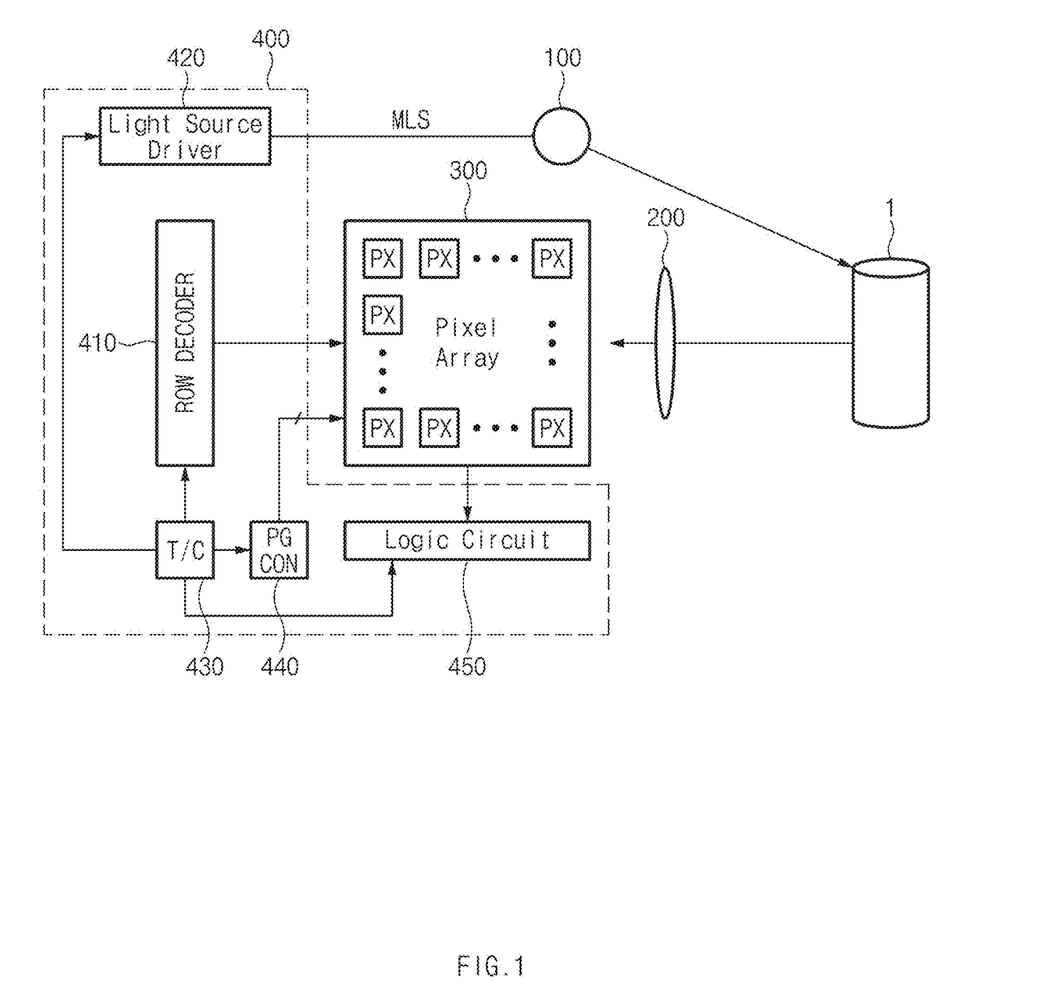
FIG. 1 is a diagram schematically illustrating a representation of an example of a configuration of an image sensor in accordance with embodiments of the disclosed technology.

FIG. 1 is a diagram schematically illustrating a representation of an example of the configuration of an image sensor in accordance with embodiments of the disclosure.

Referring to FIG. 1, the image sensor may measure a distance from a target object 1 by using a time-of-flight (ToF) method. Such an image sensor may include a light source 100, a lens module 200, a pixel array 300, and a control circuit 400.

The light source 100 irradiates light to the target object 1 in response to a clock signal MLS from the control circuit 400. The light source 100 may be a laser diode (LD), a light emitting diode (LED), a near infrared laser (NIR), a point light source, a monochromatic illumination source in which a white lamp and a monochromator are combined, or a combination of other laser light sources, which emits light of a specific wavelength band (for example, near infrared light, infrared light or visible light). For example, the light source 100 may emit infrared light having a wavelength of 800 nm to 1000 nm. The light irradiated from the light source 100 may be modulated to a predetermined frequency. While FIG. 1 illustrates only one light source 100 for the sake of convenience in explanation, it is to be noted that a plurality of light sources may be arranged around the lens module 200.

The lens module 200 may collect light reflected from the target object 1, and may focus the collected light on pixels PX of the pixel array 300. For example, the lens module 200 may include a focusing lens or other cylindrical optical element having a glass or plastic surface. The lens module 200 may include a plurality of lenses which are aligned about an optical axis.

The pixel array 300 may include a plurality of unit pixels PX which are successively arranged into a two-dimensional matrix structure (for example, are successively arranged in a column direction and a row direction). The unit pixels PX may be formed on a semiconductor substrate. Each unit pixel PX may convert light reflected from the target object 1 and then received through the lens module 200 into an electrical signal corresponding to the intensity of the light, and thereby, may output a pixel signal. The pixel signal may indicate a distance between the image sensor and the target object 1 instead of a color of the target object 1. Each unit pixel PX may be a pixel which has a pinned photodiode (PPD) structure. A detailed structure and operation of each unit pixel PX will be described later with reference to FIG. 2a.

The control circuit 400 may irradiate light to the target object 1 by controlling the light source 100, and may measure a distance to a surface of the target object 1 through processing pixel signals corresponding to light reflected from the target object 1 by driving the unit pixels PX of the pixel array 300.

Such a control circuit 400 may include a row decoder 410, a light source driver 420, a timing controller 430, a photogate controller 440, and a logic circuit 450.

The row decoder 410 may drive the unit pixels PX of the pixel array 300 in response to a timing signal outputted from the timing controller 430. For example, the row decoder 410 may generate a control signal capable of selecting at least one row line among a plurality of row lines. Such a control signal may include a reset signal for controlling a reset transistor, a select signal for controlling a select transistor, and a transfer signal for controlling the operation of a transfer transistor.

The light source driver 420 may generate the clock signal MLS capable of driving the light source 100 under the control of the timing controller 430. The clock signal MLS may be a signal which is modulated to a predetermined frequency.

The timing controller 430 may generate a timing signal for controlling operations of the row decoder 410, the light source driver 420, the photogate controller 440 and the logic circuit 450.

The photogate controller 440 may generate photogate control signals and supply them to the pixel array 300 under the control of the timing controller 430. While only the photogate controller 440 is described with reference to FIG. 1 for the sake of convenience in explanation, it is to be noted that the control circuit 400 may include a photodiode controller which generates a plurality of photodiode control signals and supplies them to the pixel array 300 under the control of the timing controller 430.

The logic circuit 450 may generate a digital signal type pixel data by processing pixel signals outputted from the pixel array 300 under the control of the timing controller 430. The logic circuit 450 may include a correlated double sampler (CDS) for performing correlated double sampling on the pixel signals outputted from the pixel array 300. Also, the logic circuit 450 may include an analog-digital converter for converting output signals from the correlated double sampler into digital signals. Further, the logic circuit 450 may include a buffer circuit for temporarily storing pixel data outputted from the analog-digital converter and outputting the pixel data to the outside under the control of the timing controller 430.

The light source 100 may emit modulated light which is modulated to a predetermined frequency, toward a scene to be captured by the image sensor. In response to receiving the modulated light (that is, incident light) reflected from the target object 1, the image sensor may generate depth information on each unit pixel. For example, the image sensor may measure time spent in generating the pixel signals since light is emitted from the light source. The light emitted from the light source 100 is reflected from the target object 1 and arrives at the photoelectric conversion elements of the unit pixels, and the pixel signals are generated upon the arrival of the light at the photoelectric conversion elements. In some implementations, a time delay between the modulated light and the incident light may occur depending on the distance between the image sensor and the target object 1. Such a time delay is represented by a phase difference between a signal generated by the image sensor and the clock signal MLS for controlling the light source 100. An image processor (not illustrated) may generate a depth image including depth information on each unit pixel by calculating a phase difference represented by a signal outputted from the image sensor.

Figure 2A:
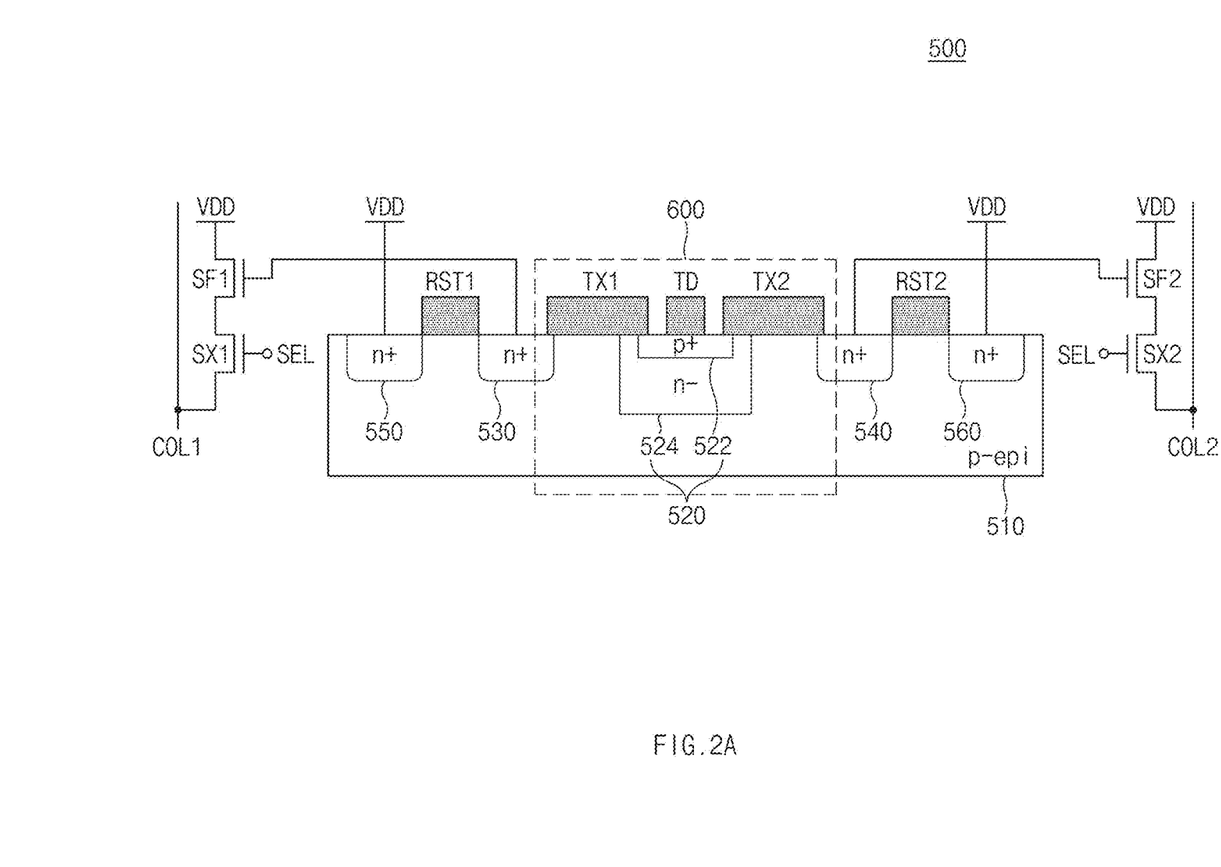
FIG. 2a is a cross sectional view illustrating an embodiment of a unit pixel illustrated in FIG. 1.

FIG. 2a is a view illustrating an embodiment of a unit pixel illustrated in FIG. 1.

Referring to FIG. 2a, a unit pixel 500 may correspond to any one of the unit pixels PX of the pixel array 300 illustrated in FIG. 1.

The unit pixel 500 may include one photodiode 520, and may include two sensing circuits including a first sensing circuit and a second sensing circuit, each capable of outputting electrical signals obtained by sensing and amplifying photocharges generated at different timings, to corresponding column lines. While the photodiode 520 is shown in FIG. 2a, the unit pixel 500 may include other photoelectric conversion elements, e.g., a photo transistor, a photo gate, or other photosensitive circuitry capable of converting incident light into a pixel signal (e.g., a charge, a voltage or a current). The first sensing circuit may include a first transfer transistor, a first reset transistor, a first source follower, and a first select transistor. Similarly, the second sensing circuit may include a second transfer transistor, a second reset transistor, a second source follower, and a second select transistor.

The unit pixel 500 may include a substrate 510, the photodiode 520, first and second floating diffusion nodes 530 and 540, first and second drain nodes 550 and 560, a photodiode gate TD, first and second transfer gates TX1 and TX2, first and second reset gates RST1 and RST2, first and second source followers SF1 and SF2, and first and second select transistors SX1 and SX2. The structure of the unit pixel 500 illustrated in FIG. 2a is for an illustration purpose only. In some implementations, some components may be omitted or any additional component may be added.

The first transfer transistor and the first reset transistor of the first sensing circuit described above may be configured by the first transfer gate TX1 and the first reset gate RST1, respectively, and the first source follower and the first select transistor of the first sensing circuit described above may correspond to the first source follower SF1 and the first select transistor SX1, respectively. The second transfer transistor and the second reset transistor of the second sensing circuit described above may be configured by the second transfer gate TX2 and the second reset gate RST2, respectively, and the second source follower and the second select transistor of the second sensing circuit described above may correspond to the second source follower SF2 and the second select transistor SX2, respectively.

The substrate 510 may have a frontside and a backside that face away from each other on opposite sides of the substrate 510. The top surface of the substrate 510 illustrated in FIG. 2a may mean the frontside, and the bottom surface of the substrate 510 illustrated in FIG. 2a may mean the backside. The unit pixel 500 may have a backside illumination type structure which receives incident light through the backside, or may have a frontside illumination type structure which receives incident light through the frontside.

The substrate 510 may be formed as or include a p type epitaxial layer p-epi. The substrate 510 may include the photodiode 520, the floating diffusion nodes 530 and 540 and the drain nodes 550 and 560 that can be configured as doped impurity layers.

The photodiode 520 may absorb incident light and accumulate photocharges corresponding to the amount of the incident light. In this implementation, the photodiode 520 may be realized by a pinned photodiode (PPD) including a pinning layer 522 and a photoelectric conversion layer 524. While the photodiode 520 is described as a pinned photodiode in this example, other implementations are also possible.

The pinning layer 522 may be provided along a surface of the substrate 100 and doped with p+ type impurities. The pinning layer 522 may suppress the generation of dark current.

The photoelectric conversion layer 524 may be provided under the pinning layer 522 and doped with n– type impurities. The photoelectric conversion layer 524 may generate and accumulate photocharges corresponding to the amount of incident light.

As illustrated in FIG. 2a, the photoelectric conversion layer 524 may have a width greater than that of the pinning layer 522. Thus, the photoelectric conversion layer 524 may have a shape which extends beyond the pinning layer 522 along the surface of substrate 100. For example, the photoelectric conversion layer 524 may include extending portions that are located on both sides, e.g., left and right sides, of the pinning layer 522. The extending portions of the photoelectric conversion layer 524 are located on the surface of the substrate and the photoelectric conversion layer 524 may be directly connected with channel regions under the first transfer gate TX1 and the second transfer gate TX2 through the extending portions of the photoelectric conversion layer 524. Thus, a potential barrier which may be formed in the region between the photodiode 520 and the first transfer transistor or between the photodiode 520 and the second transfer transistor may be removed. With no or less potential barrier between the photodiode 520 and the first or second transfer transistor, the transfer of photocharges can proceed more smoothly when the transfer transistors are turned on. In general, the impurity concentration of the photoelectric conversion layer 524 is high in the vicinity of the edge of the photoelectric conversion layer 524. Due to the high impurity concentration, the potential around the edge of the photoelectric conversion layer 524 may increase, thereby forming a potential barrier. Since the suggested implementation provides the photoelectric conversion layer 524 having the extending portions on both sides of the pinning layer 522, the photoelectric conversion layer 524 can be directly connected with the channel regions under the first transfer gate TX1 and the second transfer gate TX2. Thus, a potential barrier, which existed around the edge of the photoelectric conversion layer 524, can be removed.

Each of the first and second floating diffusion nodes 530 and 540 may be provided as an n+ doped region and accumulate photocharges transferred through each of the first and second transfer transistors from the photodiode 520. The first and second floating diffusion nodes 530 and 540 may be disposed to be spaced apart along the surface of the substrate 510 from the photodiode 520, respectively by a predetermined distance.

The first and second drain nodes 550 and 560 may be provided as n+ doped regions. The first and second drain nodes 550 and 560 may receive photocharges through the first and second reset transistors from the first and second floating diffusion nodes 530 and 540, respectively, and drain the photocharges to a power supply voltage VDD.

The photodiode gate TD may be disposed between the first transfer gate TX1 and the second transfer gate TX2 on a region corresponding to the center part of the photodiode 520, and may receive a photodiode signal and control potential under the photodiode gate TD.

The first transfer gate TX1 may be disposed on a region between the photodiode 520 and the first floating diffusion node 530 while overlapping at least partially with the photodiode 520 and the first floating diffusion node 530. The first transfer gate TX1 may receive a first transfer signal V_TX1 (see FIG. 3a) and control the turn-on and turn-off of the first transfer transistor. If the first transfer transistor is turned on, a channel may be formed in the region between the photodiode 520 and the first floating diffusion node 530, and thereby, photocharges accumulated in the photodiode 520 may be transferred to the first floating diffusion node 530. On the contrary, if the first transfer transistor is turned off, no channel may be formed in the region between the photodiode 520 and the first floating diffusion node 530, and thereby, no photocharge transfer may occur between the photodiode 520 and the first floating diffusion node 530.

The second transfer gate TX2 may be disposed on a region between the photodiode 520 and the second floating diffusion node 540 while overlapping at least partially with the photodiode 520 and the second floating diffusion node 540. The second transfer gate TX2 may receive a second transfer signal V_TX2 (see FIG. 3a) and control the turn-on and turn-off of the second transfer transistor. If the second transfer transistor is turned on, a channel may be formed in the region between the photodiode 520 and the second floating diffusion node 540, and thereby, photocharges accumulated in the photodiode 520 may be transferred to the second floating diffusion node 540. On the contrary, if the second transfer transistor is turned off, no channel may be formed in the region between the photodiode 520 and the second floating diffusion node 540, and thereby, no photocharge transfer may occur between the photodiode 520 and the second floating diffusion node 540.

The first reset gate RST1 may be disposed on a region between the first floating diffusion node 530 and the first drain node 550 while overlapping at least partially with the first floating diffusion node 530 and the first drain node 550. The first reset gate RST1 may receive a first reset signal and control the turn-on and turn-off of the first reset transistor. If the first reset transistor is turned on, a channel may be formed in the region between the first floating diffusion node 530 and the first drain node 550, and thereby, photocharges accumulated in the first floating diffusion node 530 may be transferred to the first drain node 550. On the contrary, if the first reset transistor is turned off, no channel may be formed in the region between the first floating diffusion node 530 and the first drain node 550, and thereby, no photocharge transfer may occur between the first floating diffusion node 530 and the first drain node 550.

The second reset gate RST2 may be disposed on a region between the second floating diffusion node 540 and the second drain node 560 while overlapping at least partially with the second floating diffusion node 540 and the second drain node 560. The second reset gate RST2 may receive a second reset signal and control the turn-on and turn-off of the second reset transistor. If the second reset transistor is turned on, a channel may be formed in the region between the second floating diffusion node 540 and the second drain node 560, and thereby, photocharges accumulated in the second floating diffusion node 540 may be transferred to the second drain node 560. On the contrary, if the second reset transistor is turned off, no channel may be formed in the region between the second floating diffusion node 540 and the second drain node 560, and thereby, no photocharge transfer may occur between the second floating diffusion node 540 and the second drain node 560.

The first source follower SF1 may have a gate which is connected to the first floating diffusion node 530, and may be connected between the power supply voltage VDD and the first select transistor SX1. The first source follower SF1 may amplify a change in the electrical potential of the first floating diffusion node 530, and thereby, may transfer a signal corresponding to the change in the electrical potential of the first floating diffusion node 530, to the first select transistor SX1.

The second source follower SF2 may have a gate which is connected to the second floating diffusion node 540, and may be connected between the power supply voltage VDD and the second select transistor SX2. The second source follower SF2 may amplify a change in the electrical potential of the second floating diffusion node 540, and thereby, may transfer a signal corresponding to the change in the electrical potential of the second floating diffusion node 540, to the second select transistor SX2.

The first select transistor SX1 may be applied with a select signal SEL through a gate thereof, and may be connected between the first source follower SF1 and a first column line COL1. The first select transistor SX1 may be turned on depending on the select signal SEL, and thereby, may output the signal corresponding to the change in the electrical potential of the first floating diffusion node 530, provided from the first source follower SF1, to the first column line COL1.

The second select transistor SX2 may be applied with the select signal SEL through a gate thereof, and may be connected between the second source follower SF2 and a second column line COL2. The second select transistor SX2 may be turned on depending on the select signal SEL, and thereby, may output the signal corresponding to the change in the electrical potential of the second floating diffusion node 540, provided from the second source follower SF2, to the second column line COL2.

The unit pixel 500 may output photocharges generated in a first period, to the first column line COL1 through the first sensing circuit, and may output photocharges generated in a second period, to the second column line COL2 through the second sensing circuit. The first period and the second period may be successive time periods. To this end, the first transfer transistor may be turned on in the first period and be turned off in the second period, and the second transfer transistor may be turned off in the first period and be turned on in the second period. For example, the first transfer signal V_TX1 (see FIG. 3a) and the second transfer signal V_TX2 (see FIG. 3a) may be signals which have opposite phases. Each of the first transfer signal V_TX1 and the second transfer signal V_TX2 may have a specific phase difference (e.g., 0 degree, 90 degrees, 180 degrees or 270 degrees) with respect to the clock signal MLS which drives the light source 100.

In the example shown in FIG. 2a, the unit pixel includes the photoelectric conversion layer 524 whose width is greater than that of the pinning layer 522. However, other implementations are also possible. For example, the width of the photoelectric conversion layer 524 may be substantially the same as the width of the pinning layer 522, or the width of the photoelectric conversion layer 524 may be smaller than the width of the pinning layer 522.

Figure 2B:
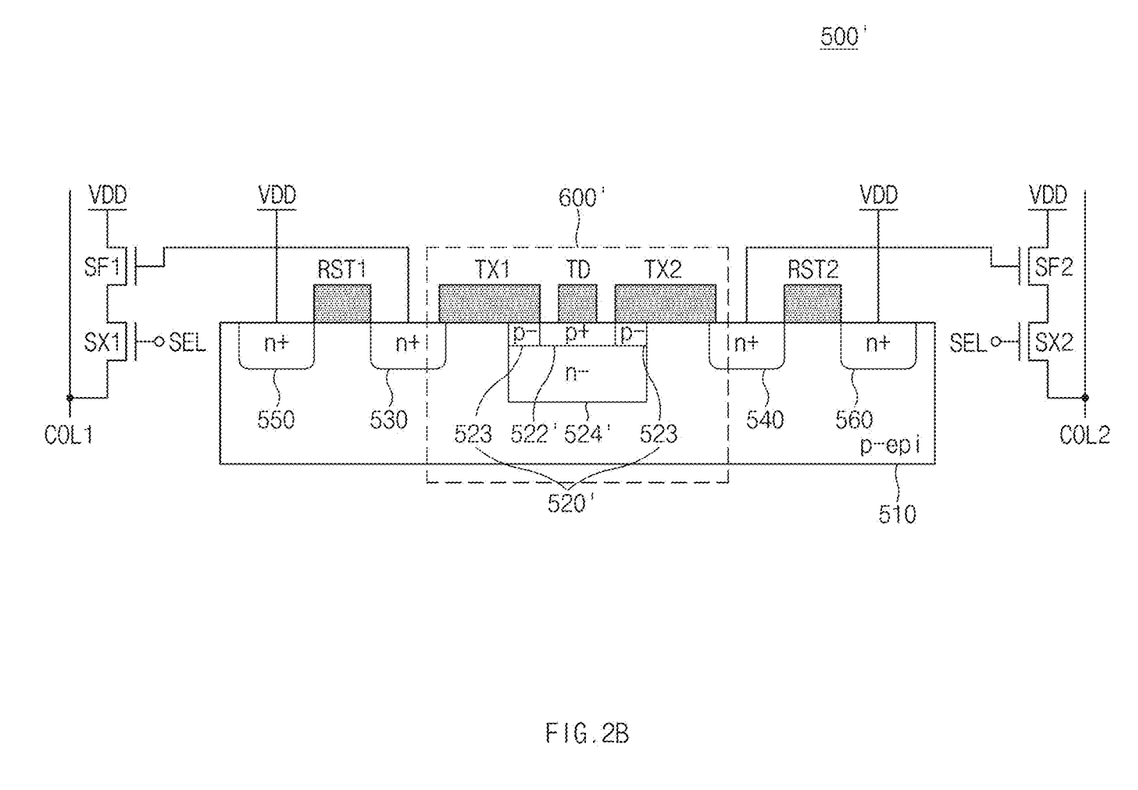
FIG. 2b is a cross sectional view illustrating another embodiment of a unit pixel illustrated in FIG. 1.

FIG. 2b is a cross sectional view illustrating another embodiment of the unit pixel illustrated in FIG. 1.

Referring to FIG. 2b, a unit pixel 500' may correspond to any one of the unit pixels PX of the pixel array 300 illustrated in FIG. 1.

The unit pixel 500' may include one photodiode 520', and may include two sensing circuits including a first sensing circuit and a second sensing circuit, each capable of outputting electrical signals obtained by sensing and amplifying photocharges generated at different timings, to corresponding column lines. As described with reference to FIG. 2a, the unit pixel 500' includes the photodiode 520' as an example of a photoelectric conversion element and other photoelectric conversion elements, e.g., a photo transistor, a photo gate, or other photosensitive circuitry capable of converting incident light into a pixel signal (e.g., a charge, a voltage or a current) instead of the photodiode 520' can be included in the unit pixel 500'. The first sensing circuit may include a first transfer transistor, a first reset transistor, a first source follower, and a first select transistor. Similarly, the second sensing circuit may include a second transfer transistor, a second reset transistor, a second source follower, and a second select transistor.

The unit pixel 500' may include a substrate 510, the photodiode 520', first and second floating diffusion nodes 530 and 540, first and second drain nodes 550 and 560, a photodiode gate TD, first and second transfer gates TX1 and TX2, first and second reset gates RST1 and RST2, first and second source followers SF1 and SF2, and first and second select transistors SX1 and SX2. The structure of the unit pixel 500' illustrated in FIG. 2b is for an illustration purpose. In some implementations, some components may be omitted or any additional component may be added.

Since the structures and operations of components except the photodiode 520' among the components of the unit pixel 500' are substantially the same as those of corresponding components described above with reference to FIG. 2a, detailed descriptions thereof will be omitted herein.

The photodiode 520' may receive or absorb incident light and accumulate photocharges corresponding to the amount of the incident light. The photodiode 520' may be realized by a pinned photodiode (PPD), and may include a first pinning layer 522', a second pinning layer 523 and a photoelectric conversion layer 524'.

The first pinning layer 522' and the second pinning layer 523 are provided along the surface of the substrate 510 such that the second pinning layer 523 are disposed on both sides of the first pinning layer 522'. The first pinning layer 522' may be doped with the p+ type impurities and the second pinning layer 523 may be doped with the p– type impurities. The first pinning layer 522' and the second pinning layer 523 may suppress the generation of dark current. While each of the first pinning layer 522' and the second pinning layer 523 is doped with p type ions, the doping concentration of the first pinning layer 522' may be higher than the doping concentration of the second pinning layer 523. Further, the doping concentration of the second pinning layer 523 may be lower than the doping concentration of the substrate 510. In some implementations, the first pinning layer 522' and the second pinning layer 523 may have the same thickness as each other. In some other implementations, any one layer of the first pinning layer 522' and the second pinning layer 523 may be thicker than the other layer.

The photoelectric conversion layer 524' may be doped with the n– type impurities and provided under the first pinning layer 522' and the second pinning layer 523. The photoelectric conversion layer 524' may generate and accumulate photocharges corresponding to the amount of incident light. The photoelectric conversion layer 524' may have a width that is same as or different from that of the photoelectric conversion layer 524 illustrated in FIG. 2a.

As illustrated in FIG. 2b, the second pinning layer 523 having the doping concentration lower than the first pinning layer 522' may be disposed under each of the first transfer gate TX1 and the second transfer gate TX2. Accordingly, it is not the first pinning layer 522' but the second pinning layer 523 may be that is disposed under each of the first transfer gate TX1 and the second transfer gate TX2. By having the second pinning layer 523 instead of the first pinning layer 522 be disposed under the first and second transfer gates TX1 and TX2, it is possible to remove potential pockets which are used to be formed under the first and second transfer gates TX1 and TX2. The potential pockets are formed due to the increase of the potential at the region where the transfer gates TX1 and TX2 and the photoelectric conversion layer 524' overlap with each other and such increase of the potential is caused when the impurity concentration of the overlapping regions is higher than channel regions close to the floating diffusion nodes 530 and 540. In this implementation, as the second pinning layer 523 having the doping concentration lower than the first pinning layer 522' is disposed under the transfer gates TX1 and TX2, potential pockets which are likely to be formed under the transfer gates TX1 and TX2 can be removed, which makes it possible to smoothly transfer photocharges when the transfer transistors are turned on. Thus, by disposing the second pinning layer 523 having an impurity concentration lower than the first pinning layer 522' and the substrate 510, under the transfer gates TX1 and TX2, the potential pockets can be removed.

Moreover, the potential pocket can cause an image lag. The image lag is caused by those photocharges which are temporarily trapped in the potential pockets and such trapped photocharges may move back to the photodiode 520' when the transfer transistors are turned off. As the potential pockets are removed, it is also possible to remove this undesired transfer of the trapped photocharges and thus prevent the image lag.

Figure 3A:
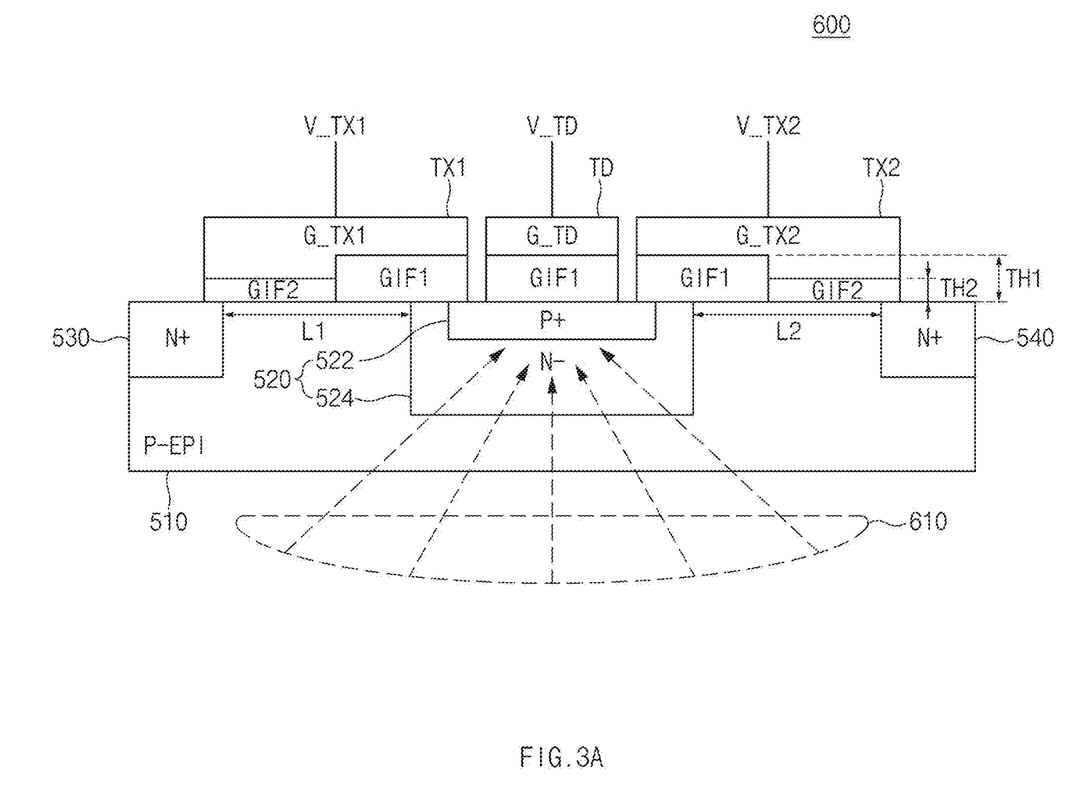

FIG. 3a is a view illustrating an example representation of a partial region of FIG. 2a.

Referring to FIG. 3a, a first region 600 of FIG. 2a is illustrated in more detail. In the first region 600, there are included the photodiode 520, the photodiode gate TD, the first and second transfer gates TX1 and TX2, and the first and second floating diffusion nodes 530 and 540.

The photodiode gate TD may include a first gate dielectric layer GIF1 and a photodiode gate electrode G_TD which are sequentially stacked on the substrate 510. The photodiode gate TD may be disposed over the region including the center part of the photodiode 520.

The first gate dielectric layer GIF1 may be disposed between the photodiode gate electrode G_TD and the substrate 510 and electrically isolate the photodiode gate electrode G_TD from the substrate 510. The first gate dielectric layer GIF1 may be or include oxide, or other dielectric materials. Thus, the material of the first gate dielectric layer GIF1 is not limited to oxide. The thickness of the first gate dielectric layer GIF1 may be referred to as a first thickness TH1.

The photodiode gate electrode G_TD may receive a photodiode signal V_TD, and in response to receiving the photodiode signal V_TD, the photodiode gate electrode G_TD may control the potential of a region corresponding to the underside of the photodiode gate TD. The photodiode gate electrode G_TD may be or include polysilicon, or other materials. Thus, the material of the photodiode gate electrode G_TD is not limited to polysilicon.

The first transfer gate TX1 may include a gate dielectric layer including the first gate dielectric layer GIF1 and the second dielectric layer GIF2 and a first transfer gate electrode G_TX1 that are sequentially stacked on the substrate 510.

The gate dielectric layer included in the first transfer gate TX1 may include the first gate dielectric layer GIF1 which overlaps at least partially with the photodiode 520 and the second gate dielectric layer GIF2 which overlaps at least partially with the first floating diffusion node 530. The first gate dielectric layer GIF1 and the second gate dielectric layer GIF2 may be disposed between the first transfer gate electrode G_TX1 and the substrate 510. The first gate dielectric layer GIF1 and the second gate dielectric layer GIF2 may electrically isolate the first transfer gate electrode G_TX1 from the substrate 510. The first gate dielectric layer GIF1 and the second gate dielectric layer GIF2 may be or include oxide or other dielectric materials. It is to be noted that the material of the first gate dielectric layer GIF1 is not limited to oxide. The thickness of the first gate dielectric layer GIF1 may be the first thickness TH1, and the thickness of the second gate dielectric layer GIF2 may be a second thickness TH2. The first thickness TH1 may be larger than the second thickness TH2. While FIG. 3*a* illustrates that the width of the first gate dielectric layer GIF1 and the width of the second gate dielectric layer GIF2 are same as each other, it is to be noted that other implementations are also possible. Thus, any one of the width of the first gate dielectric layer GIF1 and the width of the second gate dielectric layer GIF2 may be larger than the other.

The first transfer gate electrode G_TX1 may receive the first transfer signal V_TX1, and in response to receiving the first transfer signal V_TX1, the first transfer gate electrode G_TX1 may control the potential of a region corresponding to the underside of the first transfer gate TX1. The first transfer gate electrode G_TX1 may be or include polysilicon or other materials. Thus, the material of the first transfer gate electrode G_TX1 is not limited to polysilicon.

When the first transfer signal V_TX1 is applied to the first transfer gate electrode G_TX1, since the first gate dielectric layer GIF1 having the first thickness TH1 and the second gate dielectric layer GIF2 having the second thickness TH2 are disposed under the first transfer gate electrode G_TX1, the potential of a region corresponding to the underside of the first gate dielectric layer GIF1 and the potential of a region corresponding to the underside of the second gate dielectric layer GIF2 may be different from each other. The thinner the thickness of a gate dielectric layer is, the more a region corresponding to the underside of the gate dielectric layer is influenced by a voltage applied to a gate electrode. Therefore, the potential of the region corresponding to the underside of the first gate dielectric layer GIF1 having the first thickness TH1 is lower than the potential of the region corresponding to the underside of the second gate dielectric layer GIF2 having the second thickness TH2.

An interval L1 between the photodiode 520 and the first floating diffusion node 530 and an interval L2 between the photodiode 520 and the second floating diffusion node 540 may be experimentally determined to provide sufficient channel lengths to prevent a tunneling effect that is caused when the channel lengths are too short.

The second transfer gate TX2 may include a gate dielectric layer and a second transfer gate electrode G_TX2 which are sequentially stacked on the substrate 510.

The gate dielectric layer included in the second transfer gate TX2 may include a first gate dielectric layer GIF1 which overlaps at least partially with the photodiode 520 and a second gate dielectric layer GIF2 which overlaps at least partially with the second floating diffusion node 540.

When the second transfer gate electrode G_TX2 is applied with the second transfer signal V_TX2 as one voltage, since the first gate dielectric layer GIF1 having the first thickness TH1 and the second gate dielectric layer GIF2 having the second thickness TH2 are disposed under the second transfer gate electrode G_TX2, the potential of a region corresponding to the underside of the first gate dielectric layer GIF1 and the potential of a region corresponding to the underside of the second gate dielectric layer GIF2 may be different from each other. The thinner the thickness of a gate dielectric layer is, the more a region corresponding to the underside of the gate dielectric layer is influenced by a voltage applied to a gate electrode. Therefore, the potential of the region corresponding to the underside of the first gate dielectric layer GIF1 having the first thickness TH1 is lower than the potential of the region corresponding to the underside of the second gate dielectric layer GIF2 having the second thickness TH2.

The structure of the second transfer gate TX2 is substantially the same as the structure of the first transfer gate TX1 described above, and the materials of components corresponding to each other may be the same. Therefore, detailed descriptions for the second transfer gate TX2 will be omitted herein for the sake of convenience in explanation. The first transfer gate TX1 and the second transfer gate TX2 may have layouts and structures that are symmetrical to each other with respect to the photodiode gate TD.

Incident light which is incident into the unit pixel 500 may be focused on the region under the photodiode gate TD while passing through a microlens 610 disposed under the substrate 510. In this case, most photocharges which are generated by the incident light are generated and accumulated in the region under the photodiode gate TD. Such photocharges may be transferred to the first floating diffusion node 530 or the second floating diffusion node 540 by the operation of the first transfer transistor or the second transfer transistor.

Figure 3B:
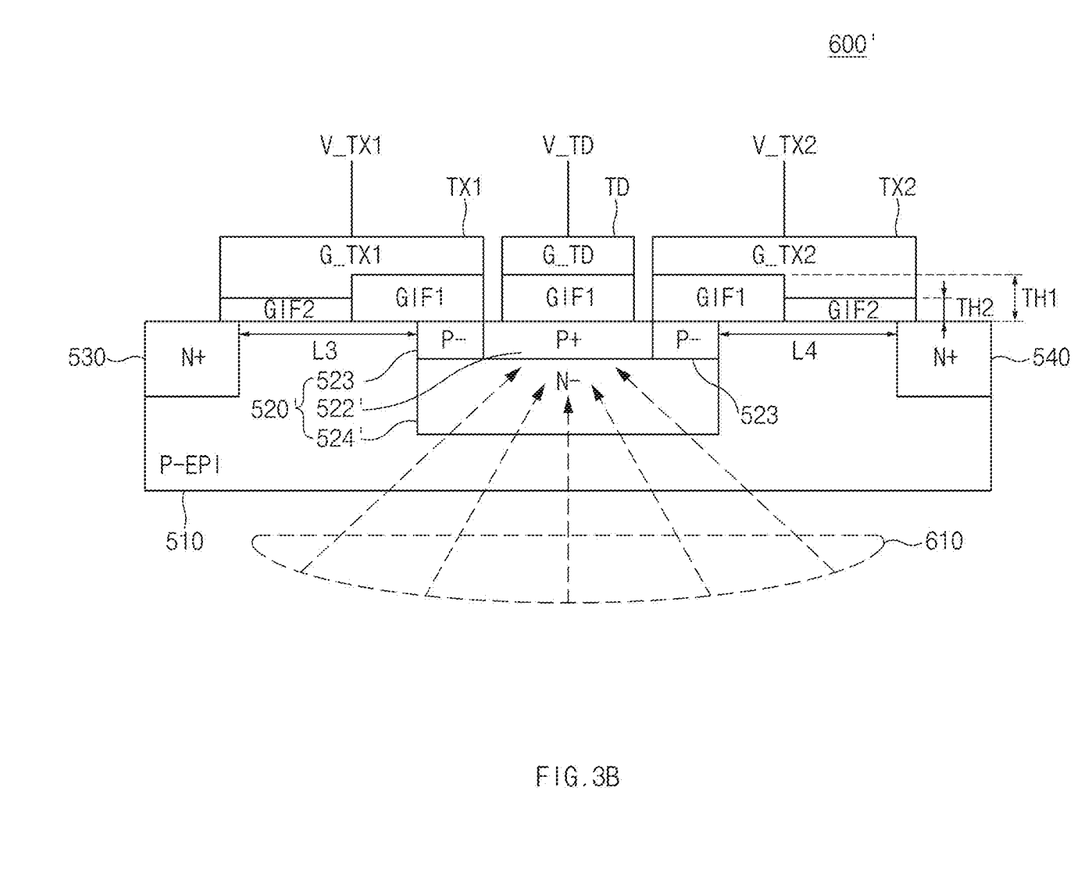
FIG. 3b is a cross sectional view illustrating an example representation of a partial region of FIG. 2b.

FIG. 3*b* is a view illustrating an example representation of a partial region of FIG. 2*b*.

Referring to FIG. 3*b*, a first region 600' of FIG. 2*b* is illustrated in more detail. In the first region 600', there are included the photodiode 520', the photodiode gate TD, the first and second transfer gates TX1 and TX2, and the first and second floating diffusion nodes 530 and 540.

Since the characteristics of the respective components described above with reference to FIG. 3*a* may be applied to respective components corresponding thereto in FIG. 3*b*, detailed descriptions thereof will be omitted herein.

Figure 4:
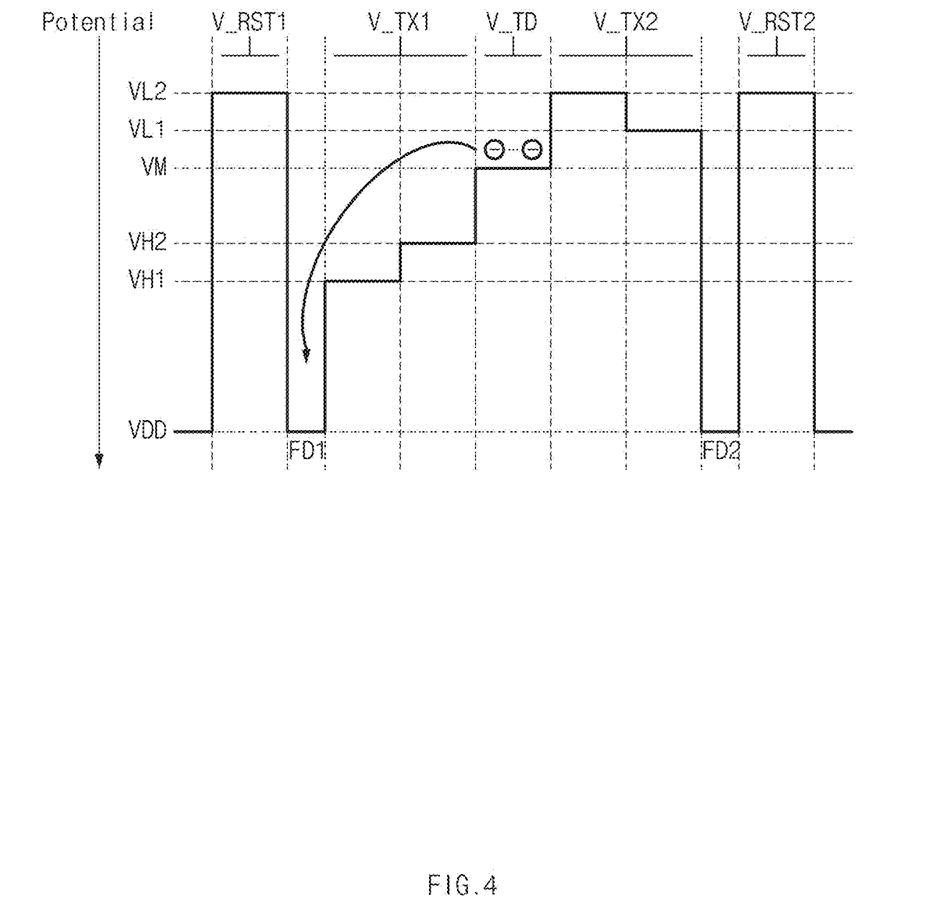
FIG. 4 is a diagram illustrating an example of a potential distribution during a first period in a unit pixel.

FIGS. 4-7 illustrate example diagrams showing potential distribution during first to fourth period of an operation of a unit pixel, respectively. FIG. 4 is a diagram illustrating a representation of an example of a potential distribution during a first period in the unit pixel.

Referring to FIG. 4, there is illustrated a potential distribution in the first period in which photocharges generated by the photodiode 520 are transferred to the first floating diffusion node 530 FD1. In the drawing, potential in each region increases in a downward direction, and each transistor may form a potential barrier when being turned off and thereby block transfer of charges between a source and a drain. If each transistor is turned on, transfer of charges between a source and a drain can be allowed. Each transistor may be turned on when a voltage of a logic high level is applied to the gate thereof, and may be turned off when a voltage of a logic low level is applied to the gate thereof. Descriptions will be made below with reference to FIGS. 4 to 7 on the assumption that the potential of the first and second floating diffusion nodes FD1 and FD2 is the same as the potential of the power supply voltage VDD, but it is to be noted that this is an example only and other implementations are also possible.

In the first period, each of a first reset signal V_RST1, a second reset signal V_RST2 and the second transfer signal V_TX2 may have a logic low level, and the first transfer signal V_TX1 may have a logic high level. Accordingly, each of the first reset transistor, the second reset transistor and the second transfer transistor may be turned off, and the first transfer transistor may be turned on. The photodiode signal V_TD may have an intermediate voltage between a voltage corresponding to a logic high level of the first transfer signal V_TX1 and a voltage corresponding to a logic low level of the second transfer signal V_TX2. The intermediate voltage does not necessarily mean an average of the voltage corresponding to a logic high level of the first transfer signal V_TX1 and the voltage corresponding to a logic low level of the second transfer signal V_TX2, and may mean a voltage lower than the voltage corresponding to a logic high level of the first transfer signal V_TX1 and higher than the voltage corresponding to a logic low level of the second transfer signal V_TX2.

A region corresponding to the photodiode gate TD has intermediate potential VM, a region corresponding to the first gate dielectric layer GIF1 of the first transfer gate TX1 has second high potential VH2 higher than the intermediate potential VM, and a region corresponding to the second gate dielectric layer GIF2 of the first transfer gate TX1 has first high potential VH1 higher than the second high potential VH2. This is because, even though the same voltage is applied to the first transfer gate TX1, the first high potential VH1 is higher than the second high potential VH2 due to the difference in thickness between the first gate dielectric layer GIF1 and the second gate dielectric layer GIF2.

As incident light is focused on the region corresponding to the underside of the photodiode gate TD due to the presence of the microlens 610, most photocharges may be generated in the region corresponding to the underside of the photodiode gate TD. Such photocharges may move to the first floating diffusion node FD1 as the first transfer transistor is turned on. At this time, the potential distribution of the first region is formed such that the potential changes from the intermediate potential VM to the first high potential VH1 through the second high potential VH2. As shown in FIG. 4, the potential of the first region gradually increases from the intermediate potential VM to the first high potential VH1, which forms a potential slope in the direction from the photodiode 520 to the first floating diffusion node FD1. Thus, a lateral field effect can be increased. As a consequence, the efficiency and speed of photocharge transfer to the first floating diffusion node FD1 can be increased.

The region corresponding to the photodiode gate TD has the intermediate potential VM, a region corresponding to the second gate dielectric layer GIF2 of the second transfer gate TX2 has first low potential VL1 lower than the intermediate potential VM, and a region corresponding to the first gate dielectric layer GIF1 of the second transfer gate TX2 has second low potential VL2 lower than the first low potential VL1. This is because, even though the same voltage is applied to the second transfer gate TX2, the first low potential VL1 is higher than the second low potential VL2 due to the difference in thickness between the first gate dielectric layer GIF1 and the second gate dielectric layer GIF2.

Since the intermediate potential VM is higher than the second low potential VL2, most photocharges generated in the region corresponding to the underside of the photodiode gate TD do not move to the second floating diffusion node FD2 by a potential barrier formed by the second low potential VL2.

Figure 5:
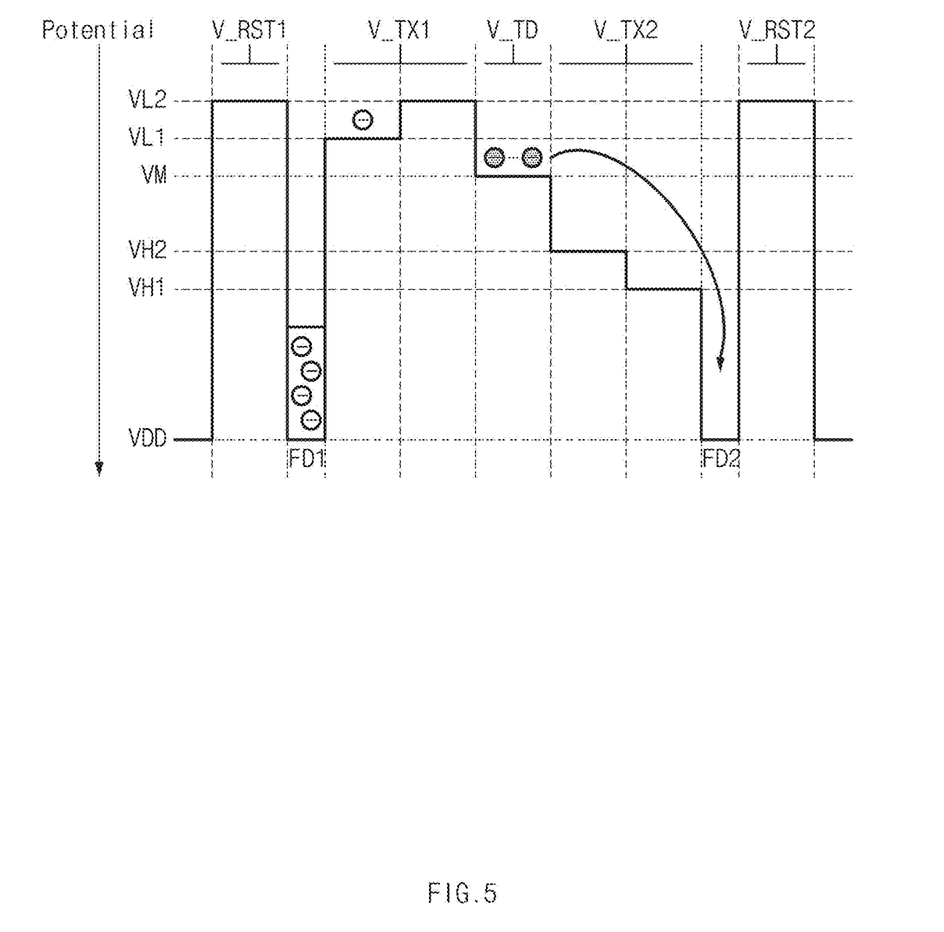
FIG. 5 is a diagram illustrating an example of a potential distribution during a second period in a unit pixel.

FIG. 5 is a diagram illustrating a representation of an example of a potential distribution during a second period in the unit pixel.

Referring to FIG. 5, there is illustrated a potential distribution in the second period in which photocharges generated by the photodiode 520 are transferred to the second floating diffusion node 540 FD2.

In the second period, each of the first reset signal V_RST1, the second reset signal V_RST2 and the first transfer signal V_TX1 may have a logic low level, and the second transfer signal V_TX2 may have a logic high level. Accordingly, each of the first reset transistor, the second reset transistor and the first transfer transistor may be turned off, and the second transfer transistor may be turned on. The photodiode signal V_TD may have an intermediate voltage between a voltage corresponding to a logic low level of the first transfer signal V_TX1 and a voltage corresponding to a logic high level of the second transfer signal V_TX2. The intermediate voltage does not necessarily mean an average of the voltage corresponding to a logic low level of the first transfer signal V_TX1 and the voltage corresponding to a logic high level of the second transfer signal V_TX2, and may mean a voltage higher than the voltage corresponding to a logic low level of the first transfer signal V_TX1 and lower than the voltage corresponding to a logic high level of the second transfer signal V_TX2.

Accordingly, the region corresponding to the photodiode gate TD has intermediate potential VM, a region corresponding to the first gate dielectric layer GIF1 of the second transfer gate TX2 has second high potential VH2 higher than the intermediate potential VM, and a region corresponding to the second gate dielectric layer GIF2 of the second transfer gate TX2 has first high potential VH1 higher than the second high potential VH2. This is because, even though the same voltage is applied to the second transfer gate TX2, the first high potential VH1 is higher than the second high potential VH2 due to the difference in thickness between the first gate dielectric layer GIF1 and the second gate dielectric layer GIF2.

As incident light is focused on the region corresponding to the underside of the photodiode gate TD due to the presence of the microlens 610, most photocharges may be generated in the region corresponding to the underside of the photodiode gate TD. Such photocharges (shaded photocharges in FIG. 5) may move to the second floating diffusion node FD2 as the second transfer transistor is turned on. At this time, the potential distribution of the first region is formed such that the potential changes from the intermediate potential VM to the first high potential VH1 through the second high potential VH2. As shown in FIG. 5, the potential of the first region gradually increases from the intermediate potential VM to the first high potential VH1, which forms a potential slope in the direction from the photodiode 520 to the second floating diffusion node FD2. Thus, a lateral field effect can be increased. As a consequence, the efficiency and speed of photocharge transfer to the second floating diffusion node FD2 can be increased.

The region corresponding to the photodiode gate TD has the intermediate potential VM, the region corresponding to the second gate dielectric layer GIF2 of the first transfer gate TX1 has first low potential VL1 lower than the intermediate potential VM, and the region corresponding to the first gate dielectric layer GIF1 of the first transfer gate TX1 has second low potential VL2 lower than the first low potential VL1. This is because, even though the same voltage is applied to the first transfer gate TX1, the first low potential VL1 is higher than the second low potential VL2 due to the difference in thickness between the first gate dielectric layer GIF1 and the second gate dielectric layer GIF2.

Since the intermediate potential VM is higher than the second low potential VL2, most photocharges generated in the region corresponding to the underside of the photodiode gate TD do not move to the first floating diffusion node FD1 by a potential barrier formed by the second low potential VL2.

In addition, since the first period corresponds to a substantially short time period, some photocharges (unshaded photocharges) of the photocharges generated in the first period may not move to the first floating diffusion node FD1, and may drift under the second gate dielectric layer GIF2 of the first transfer gate TX1. In this regard, since the second low potential VL2 is lower than the first low potential VL1, the photocharges drifting under the second gate dielectric layer GIF2 of the first transfer gate TX1 may not move to the region corresponding to the photodiode gate TD by the potential barrier formed by the second low potential VL2, and may move to the first floating diffusion node FD1. Because the photocharges drifting under the second gate dielectric layer GIF2 of the first transfer gate TX1 may act as noise to the photocharges generated in the second period, noise can be reduced by the potential barrier formed by the second low potential VL2. Thus, by such a potential barrier, the demodulation contrast of a signal generated by the unit pixel 500 may be improved.

Figure 6:
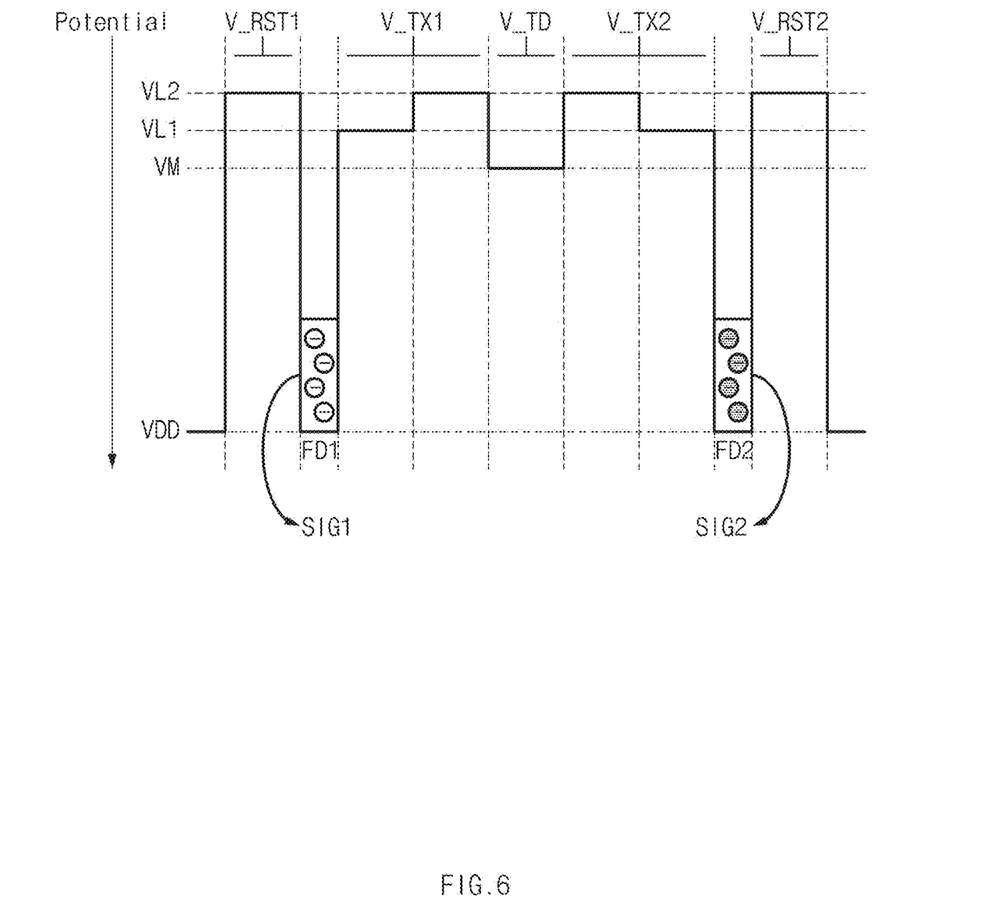
FIG. 6 is a diagram illustrating an example of a potential distribution during a third period in a unit pixel.

FIG. 6 is a diagram illustrating a representation of an example of a potential distribution during a third period in the unit pixel.

Referring to FIG. 6, there is illustrated a potential distribution in a third period in which an electrical signal corresponding to the photocharges accumulated in each of the first floating diffusion node FD1 and the second floating diffusion node FD2 is generated.

In the third period, each of the first reset signal V_RST1, the second reset signal V_RST2, the first transfer signal V_TX1 and the second transfer signal V_TX2 may have a logic low level. Accordingly, each of the first reset transistor, the second reset transistor, the first transfer transistor and the second transfer transistor may be turned off. The photodiode signal V_TD may have an intermediate voltage. According to another embodiment, the photodiode signal V_TD may have the same voltage as a voltage corresponding to a logic low level of the first transfer signal V_TX1 or the second transfer signal V_TX2, thereby reducing power consumption.

A voltage level according to the photocharges accumulated in the first floating diffusion node FD1 may be outputted, as a first output signal SIG1, to the first column line COL1 through the first source follower SF1 and the first select transistor SX1. A voltage level according to the photocharges accumulated in the second floating diffusion node FD2 may be outputted, as a second output signal SIG2, to the second column line COL2 through the second source follower SF2 and the second select transistor SX2.

Figure 7:
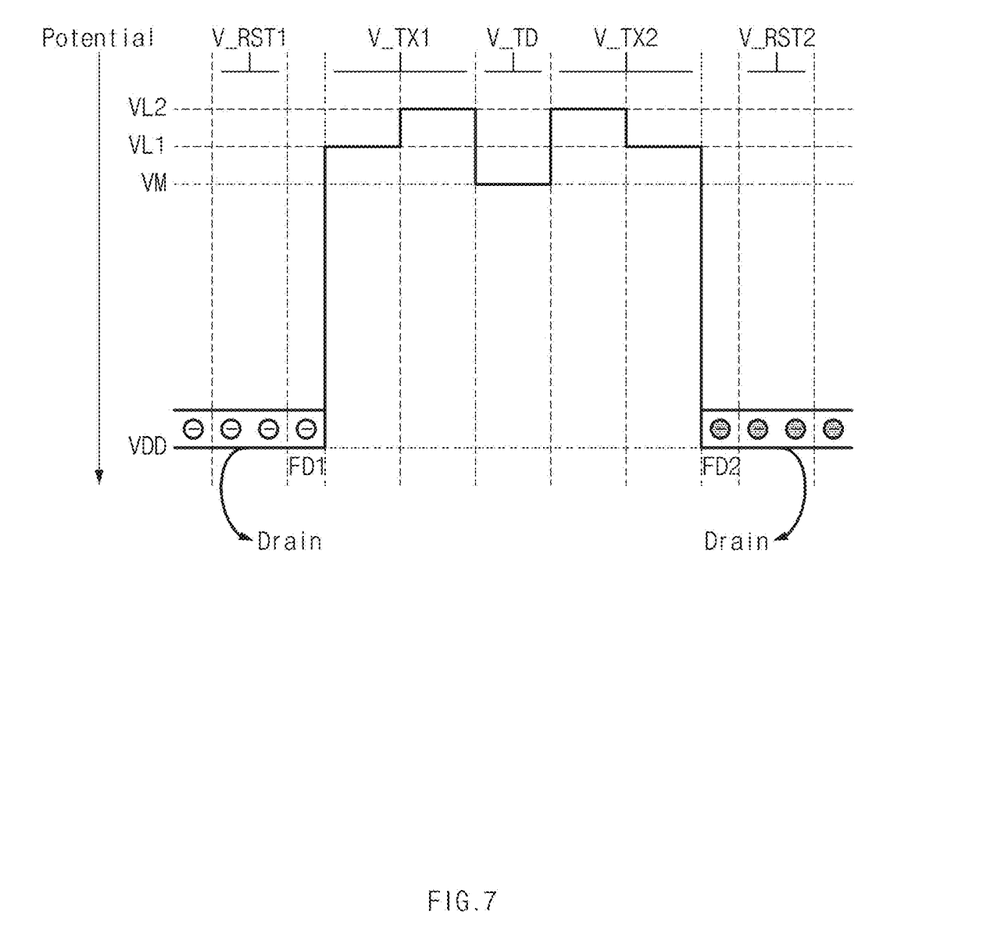
FIG. 7 is a diagram illustrating an example of a potential distribution during a fourth period in a unit pixel.

FIG. 7 is a diagram illustrating a representation of an example of a potential distribution during a fourth period in the unit pixel.

Referring to FIG. 7, there is illustrated a potential distribution in a fourth period as a period in which each of the first floating diffusion node FD1 and the second floating diffusion node FD2 is reset.

In the fourth period, each of the first reset signal V_RST1 and the second reset signal V_RST2 may have a logic high level, and each of the first transfer signal V_TX1 and the second transfer signal V_TX2 may have a logic low level. Accordingly, each of the first reset transistor and the second reset transistor may be turned on, and each of the first transfer transistor and the second transfer transistor may be turned off. The photodiode signal V_TD may have an intermediate voltage. According to another embodiment, the photodiode signal V_TD may have the same voltage as a voltage corresponding to a logic low level of the first transfer signal V_TX1 or the second transfer signal V_TX2, thereby reducing power consumption.

As the first reset transistor is turned on, the photocharges (unshaded charges) accumulated in the first floating diffusion node FD1 may move to the first drain node 550 and thereby be drained to the power supply voltage VDD. Similarly, as the second reset transistor is turned on, the photocharges (shaded charges) accumulated in the second floating diffusion node FD2 may move to the second drain node 560 and thereby be drained to the power supply voltage VDD.

While various embodiments have been described above, it will be understood to those skilled in the art that the embodiments described are by way of example only. Accordingly, the image sensor described herein should not be limited based on the described embodiments.

The invention claimed is:
1. An image sensing device comprising:
   a substrate;
   a photoelectric conversion element disposed in the substrate and configured to generate photocharges in response to an incident light;
   first and second floating diffusion nodes that are disposed in the substrate to be spaced apart from the photoelectric conversion element at opposite sides of the photoelectric conversion element respectively;
   a first transfer gate disposed on the substrate to overlap at least partially with the photoelectric conversion element and the first floating diffusion node; and
   a second transfer gate disposed on the substrate to overlap at least partially with the photoelectric conversion element and the second floating diffusion node,
   wherein each of the first transfer gate and the second transfer gate includes a first gate dielectric layer which overlaps at least partially with the photoelectric conversion element and a second gate dielectric layer which overlaps at least partially with the first or second floating diffusion node, and wherein a thickness of the first gate dielectric layer is greater than a thickness of the second gate dielectric layer.

2. The image sensing device according to claim 1, wherein the photoelectric conversion element includes a pinning layer disposed along a surface of the substrate and a photoelectric conversion layer disposed under the pinning layer and doped with n− type impurities.

3. The image sensing device according to claim 2, wherein a width of the photoelectric conversion layer is greater than a width of the pinning layer.

4. The image sensing device according to claim 2, wherein the pinning layer includes a first pinning layer doped with p+ type impurities and a second pinning layer doped with p− type impurities, and the second pinning layer is disposed under the first transfer gate or the second transfer gate.

5. The image sensing device according to claim 1, further comprising:
a photoelectric conversion gate disposed between the first transfer gate and the second transfer gate at a region corresponding to a center part of the photoelectric conversion element.

6. The image sensing device according to claim 5, wherein the photoelectric conversion gate includes the first gate dielectric layer and a photoelectric conversion gate electrode disposed over the first gate dielectric layer.

7. The image sensing device according to claim 1, wherein the first transfer gate further includes a first transfer gate electrode disposed over the first gate dielectric layer and the second gate dielectric layer of the first transfer gate, and the second transfer gate further includes a second transfer gate electrode disposed over the first gate dielectric layer and the second gate dielectric layer of the second transfer gate.

8. The image sensing device according to claim 1, wherein the first transfer gate is configured to receive a first transfer signal corresponding to a logic high level during a first period, and potential of a region corresponding to an underside of the first gate dielectric layer of the first transfer gate is lower than potential of a region corresponding to an underside of the second gate dielectric layer of the first transfer gate.

9. The image sensing device according to claim 8, wherein the second transfer gate is configured to receive with a second transfer signal corresponding to a logic low level during the first period, and potential of a region corresponding to an underside of the first gate dielectric layer of the second transfer gate is lower than potential of a region corresponding to an underside of the second gate dielectric layer of the second transfer gate.

10. The image sensing device according to claim 9, further comprising a photoelectric conversion gate disposed between the first transfer gate and the second transfer gate and configured to receive, during the first period, a signal corresponding to an intermediate voltage between a voltage of the first transfer signal and a voltage of the second transfer signal.

11. The image sensing device according to claim 1, wherein the second transfer gate is configured to receive a second transfer signal corresponding to a logic high level during a second period, and potential of a region corresponding to an underside of the first gate dielectric layer of the second transfer gate is lower than potential of a region corresponding to an underside of the second gate dielectric layer of the second transfer gate.

12. The image sensing device according to claim 11, wherein the first transfer gate is configured to receive a first transfer signal corresponding to a logic low level during the second period, and potential of a region corresponding to an underside of the first gate dielectric layer of the first transfer gate is lower than potential of a region corresponding to an underside of the second gate dielectric layer of the first transfer gate.

13. The image sensing device according to claim 12, further comprising a photoelectric conversion gate disposed between the first transfer gate and the second transfer gate and configured to receive, during the second period, a signal corresponding to an intermediate voltage between a voltage of the first transfer signal and a voltage of the second transfer signal.

14. The image sensing device according to claim 1, further comprising:
a microlens disposed under the substrate and configured to focus incident light on a center part of the photoelectric conversion element.

15. The image sensing device according to claim 1, wherein
the substrate includes a p type epitaxial layer, and
the first and second floating diffusion nodes are doped with n+ type impurities.

16. An image sensing device comprising:
a substrate;
a photoelectric conversion element disposed in the substrate and configured to generate photocharges in response to an incident light;
a first transfer gate disposed on the substrate to overlap at least partially with one side of the photoelectric conversion element;
a second transfer gate disposed on the substrate to overlap at least partially with the other side of the photoelectric conversion element; and
a photoelectric conversion gate disposed between the first transfer gate and the second transfer gate,
wherein each of the first transfer gate and the second transfer gate includes a first gate dielectric layer which overlaps at least partially with the photoelectric conversion element and having a first thickness and a second gate dielectric layer having a second thickness smaller than the first thickness, and
wherein the first transfer gate is configured to receive a first transfer signal corresponding to a logic high level that provides a potential distribution increasing from an underside of the second transfer gate to an underside of the first transfer gate.

17. The image sensing device according to claim 16, wherein the potential distribution increases in following order: an underside of the first gate dielectric layer of the second transfer gate, an underside of the second gate dielectric layer of the second transfer gate, an underside of the photoelectric conversion gate, an underside of the first gate dielectric layer of the first transfer gate, and an underside of the second gate dielectric layer of the first transfer gate.

18. The image sensing device according to claim 16, wherein the second transfer gate is configured to receive a second transfer signal corresponding to a logic high level that provides a potential distribution increasing in following order: the underside of the first gate dielectric layer of the first transfer gate, the underside of the second gate dielectric layer of the first transfer gate, the underside of the photoelectric conversion gate, the underside of the first gate dielectric layer of the second transfer gate, and the underside of the second gate dielectric layer of the second transfer gate.

19. The image sensing device according to claim 16, wherein the photoelectric conversion gate includes the first gate dielectric layer and a photoelectric conversion gate electrode disposed over the first gate dielectric layer.

20. The image sensing device according to claim 16, wherein
- the first transfer gate includes a first transfer gate electrode disposed over the first gate dielectric layer and the second gate dielectric layer of the first transfer gate, and
- the second transfer gate includes a second transfer gate electrode disposed over the first gate dielectric layer and the second gate dielectric layer of the second transfer gate.

* * * * *